United States Patent
Liu et al.

(10) Patent No.: US 7,135,365 B2
(45) Date of Patent: Nov. 14, 2006

(54) METHOD OF MANUFACTURING MOS TRANSISTORS

(75) Inventors: Yi-Cheng Liu, Taipei (TW); Wen-Chi Chen, Chang-Hua Hsien (TW); Tzu-Yun Chang, Hsin-Chu Hsien (TW); Bang-Chiang Lan, Taipei (TW); Cheng-Tung Huang, Kao-Hsiung (TW); Wei-Tsun Shiau, Kao-Hsiung Hsien (TW); Kuan-Yang Liao, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/907,342

(22) Filed: Mar. 30, 2005

(65) Prior Publication Data

US 2006/0228847 A1    Oct. 12, 2006

(51) Int. Cl.
*H01L 21/8238* (2006.01)
*H01L 21/336* (2006.01)

(52) U.S. Cl. ...................................... 438/219; 438/301
(58) Field of Classification Search ................ 438/219, 438/301, 482, 657, 660; 257/E21.415, E21.442, 257/E21.438, E21.199
See application file for complete search history.

(56) References Cited

U.S. PATENT DOCUMENTS

| 6,107,147 A | * | 8/2000 | Kim et al. ................... 438/301 |
| 2004/0262692 A1 | * | 12/2004 | Hareland et al. ............ 257/369 |
| 2005/0112817 A1 | * | 5/2005 | Cheng et al. ................ 438/219 |

\* cited by examiner

*Primary Examiner*—Walter L. Lindsay, Jr.
(74) *Attorney, Agent, or Firm*—Winston Hsu

(57) ABSTRACT

First, a substrate having a plurality of NMOS transistor regions and PMOS transistor regions is provided. The substrate further includes a plurality of gate structures respectively positioned in the NMOS transistor regions and the PMOS transistor regions. A high-tensile thin film is then formed on the substrate and the plurality of gate structures. Subsequently, an annealing process is performed, and the high-tensile thin film is removed after the annealing process.

13 Claims, 10 Drawing Sheets

METHOD OF MANUFACTURING MOS TRANSISTORS

BACKGROUND OF INVENTION

1. Field of the Invention

The present invention pertains to a method of manufacturing MOS transistors, and more particularly, to a method that utilizes a high-tensile thin film in combination with an annealing process to alter a band structure of a channel region in a substrate, thereby improving carrier mobility of the MOS transistors.

2. Description of the Prior Art

The performance of MOS transistors has increased year after year with the diminution of critical dimensions and the advance of large-scale integrated circuits (LSI). However, it has been recently pointed out that the miniaturization attained by a lithographic technology has reached its limit. Therefore, how to improve the carrier mobility so as to increase the speed performance of MOS transistors has become a major topic for study in the semiconductor field. For the known arts, attempts have been made to use a strained silicon layer, which has been grown epitaxially on a silicon substrate with a silicon germanium (SiGe) layer disposed therebetween. In this type of MOS transistor, a biaxial tensile strain occurs in the epitaxy silicon layer due to the silicon germanium which has a larger lattice constant than silicon, and, as a result, the band structure alters, and the carrier mobility increases. This enhances the speed performance of the MOS transistors.

However, the above technique still suffers the following disadvantages. First, the silicon germanium is deposited across the substrate, making it harder to optimize NMOS and PMOS transistors separately. Second, the silicon germanium layer has poor thermal conductivity. Another concern is that some dopants diffuse more rapidly through the SiGe layer, resulting in a sub-optimum diffusion profile in the source/drain region.

SUMMARY OF INVENTION

It is therefore a primary objective of the claimed invention to provide a method of manufacturing MOS transistors to overcome the aforementioned problems.

According to the claimed invention, a method of manufacturing MOS transistors is provided. First, a substrate including a plurality of NMOS transistor regions and a plurality of PMOS transistor regions is provided. The substrate further includes a plurality of gate structures positioned in each NMOS transistor region and in each PMOS transistor region. Subsequently, a high-tensile thin film is formed on the substrate. The high-tensile thin film covers the gate structures. Following that, an annealing process is performed, and the high-tensile thin film is removed. The gate structures are inherently polysilicon gate structures. The method of the present invention further includes performing a pre-amorphization (PAI) process to transfer each polysilicon gate structure to an amorphous-silicon gate structure prior to forming the high-tensile thin film, and the amorphous-silicon gate structures are recrystallized into polysilicon gate structures in the annealing process.

The present invention utilizes a high-tensile thin film in combination with an annealing process for recrystallizing the amorphous-silicon gate structures into polysilicon gate structures, thereby altering a band structure of the substrate in a channel region. Consequently, carrier mobility is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
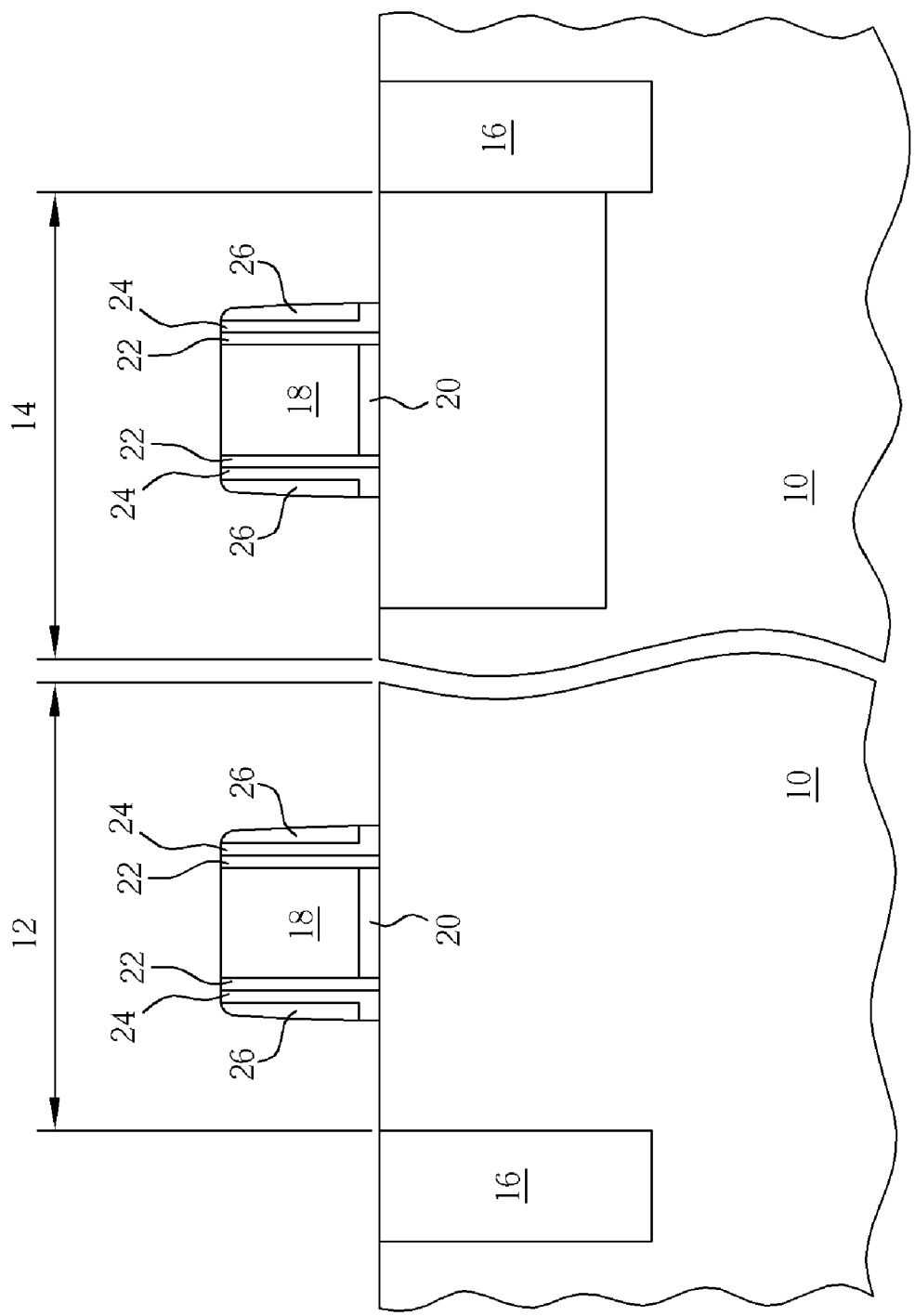
FIG. 1 through FIG. 5 are schematic diagrams illustrating a method of manufacturing MOS transistors according to a first preferred embodiment of the present invention.

Please refer to FIG. 1 through FIG. 5, which are schematic diagrams illustrating a method of manufacturing MOS transistors according to a first preferred embodiment of the present invention. For highlighting the characteristic of the present invention and for clear illustration, FIG. 1 through FIG. 5 only show an NMOS transistor region and a PMOS transistor region. As shown in FIG. 1, a substrate 10, such as a silicon substrate, is provided. The substrate 10 includes a plurality of NMOS transistor regions 12 and a plurality of PMOS transistor regions 14 insulated by a plurality of shallow trench insulators (STI) 16. The substrate 10 further includes a plurality of polysilicon gate structures 18 respectively positioned in each NMOS transistor region 12 and in each PMOS transistor region 14, and a plurality of gate insulating layers 20 positioned between each polysilicon gate structure 18 and the substrate 10. Subsequently, a liner layer 22, a dielectric layer 24, and a spacer 26 are respectively formed alongside each polysilicon gate structure 18 using deposition, lithographic, and etching processes.

Figure 2:
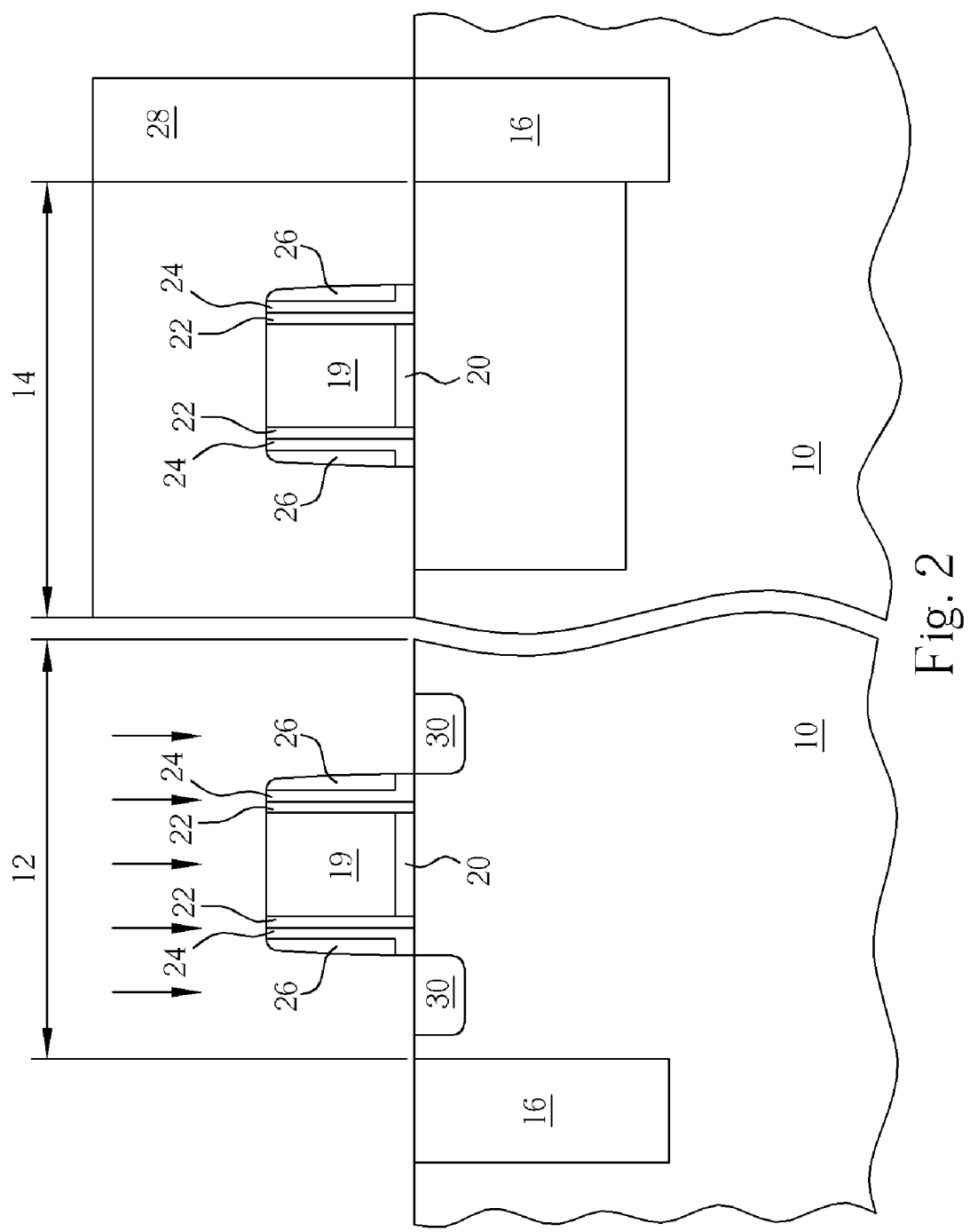
Figure 3:
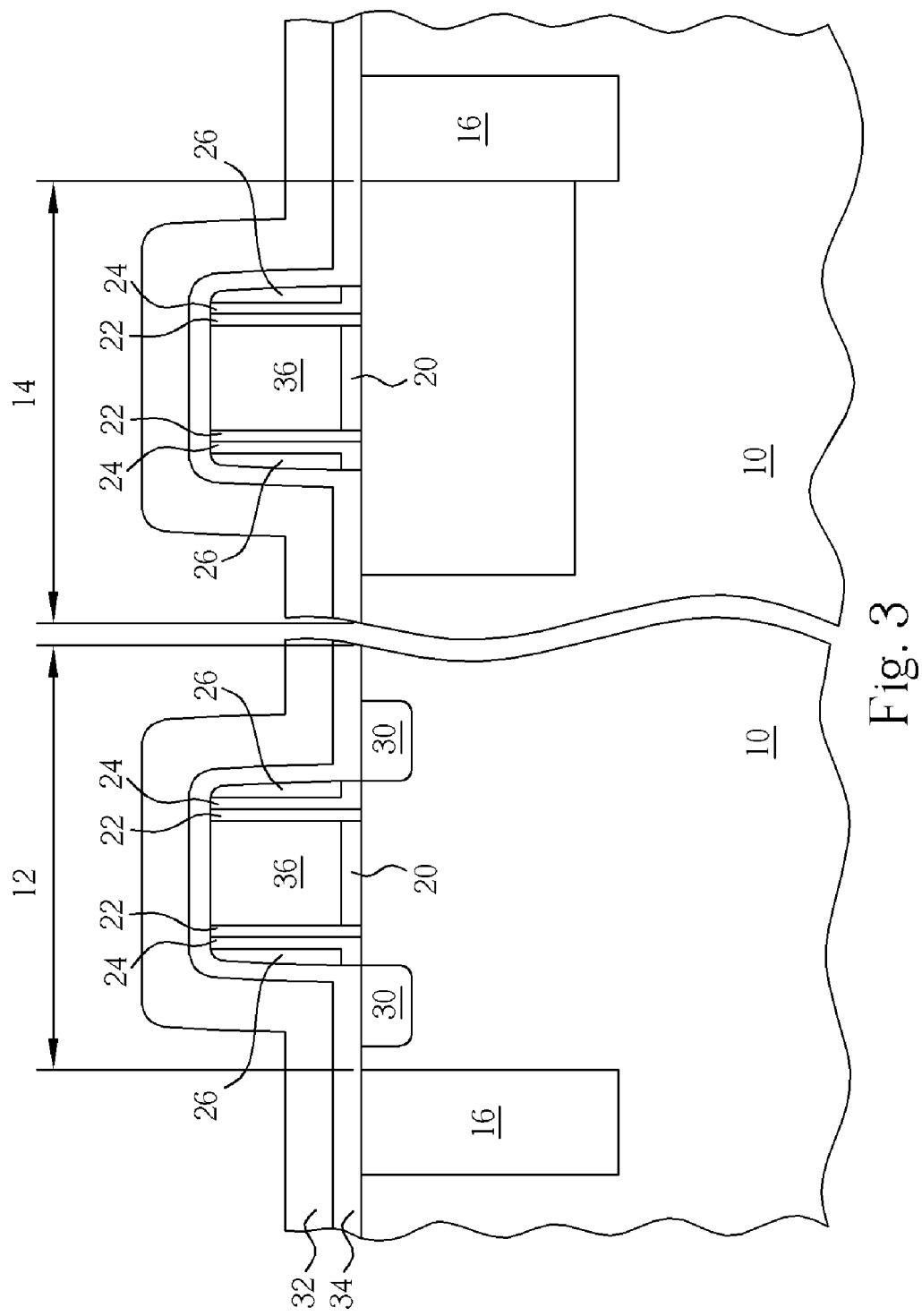

As shown in FIG. 2, a pre-amorphization (PAI) process is carried out to transfer each polysilicon gate structre 18 to an amorphous-silicon gate structure 19. Subsequently, a masking pattern 28, such as a photoresist pattern, is formed over the PMOS transistor regions 12, and a first implantation process is performed upon the NMOS transistor regions 12 using N-type dopants, e.g. arsenic or phosphorous, to form a source/drain region 30 in each NMOS transistor region 12. As shown in FIG. 3, the masking pattern 28 is removed, and a high-tensile thin film 32 is deposited across the substrate 10. In this embodiment, the high-tensile thin film 32 is a silicon nitride thin film, and a silicon oxide thin film 34 is formed on the substrate 10 prior to forming the high-tensile thin film 32. Then, a low-temperature annealing process, such as a low-temperature oxygen annealing process or a low-temperature nitrogen annealing process, is performed for recrystallizing the amorphous-silicon gate structures 19 into polysilicon gate structures 36. Accordingly, the lattice constant of the substrate 10 under the polysilicon gate structures 36 is enlarged, and thus the carrier mobility is improved. In this embodiment, the annealing temperature is between 100 C and 1000 C, and is preferably 525 C. In addition, the sequences of the PAI process and the first implantation process can be swapped where necessary.

Figure 4:
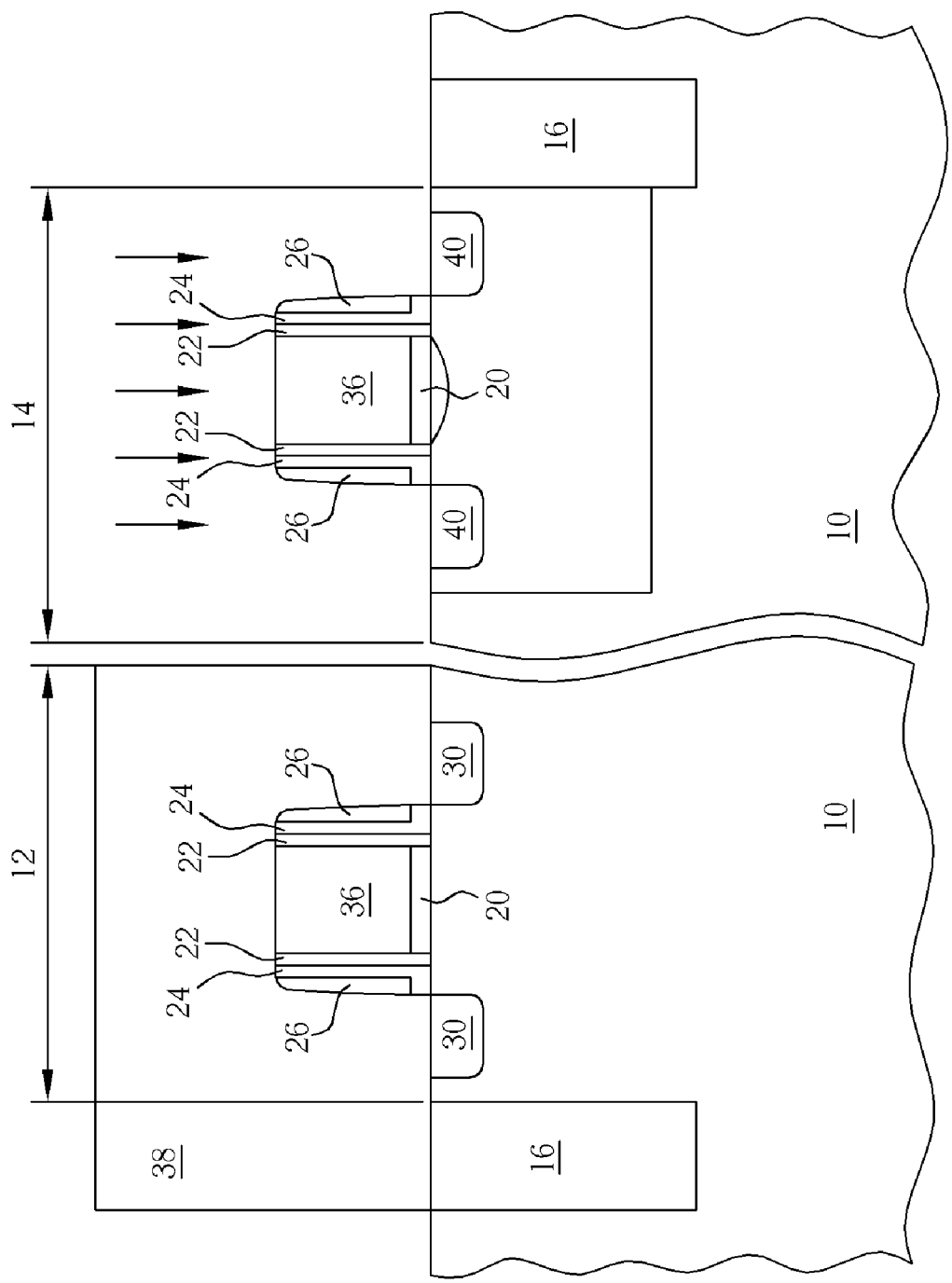
Figure 5:
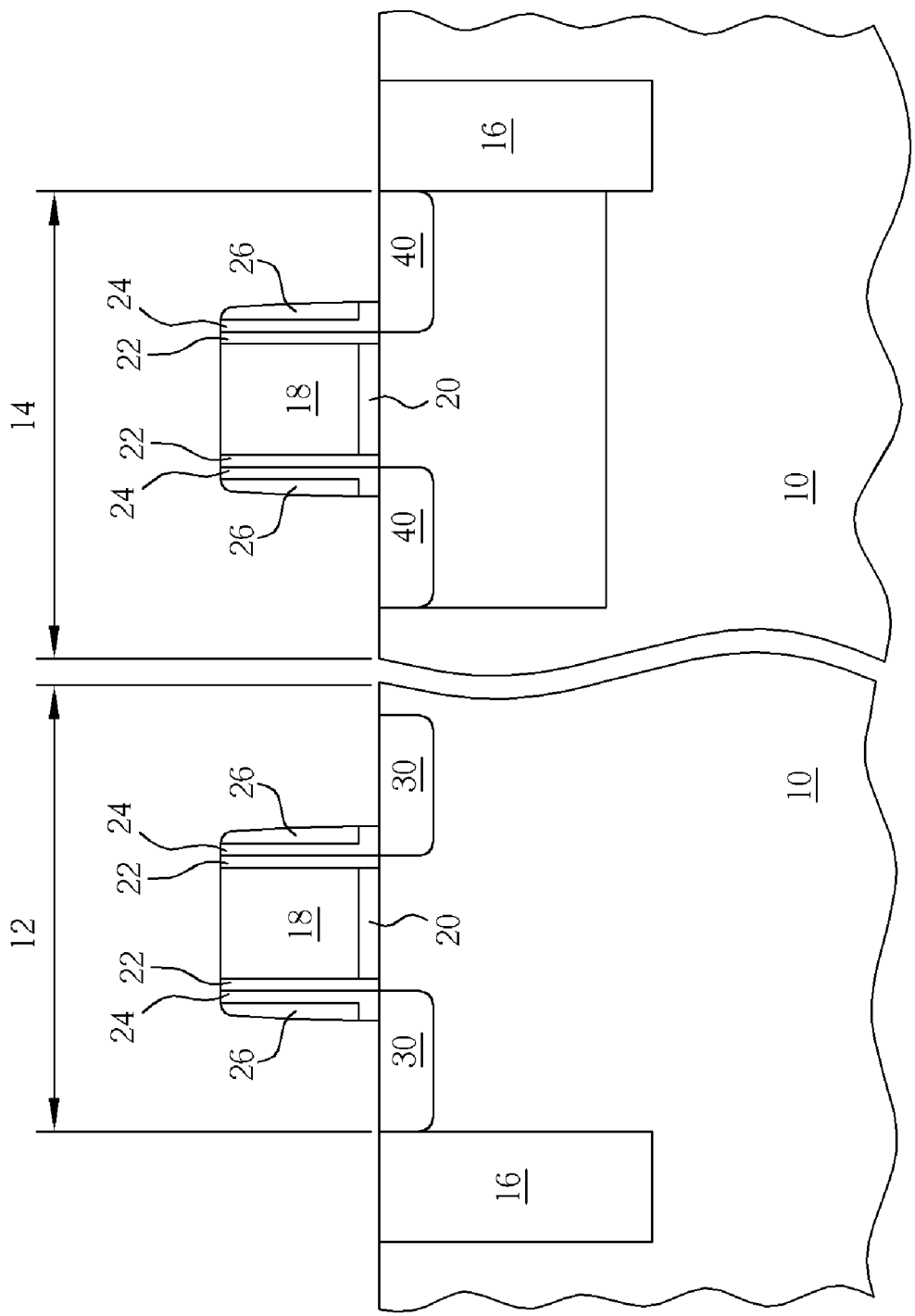

As shown in FIG. 4, the high-tensile thin film 32 and the silicon oxide thin film 34 are removed. Then, another masking pattern 38 is formed over the NMOS transistor regions 12, and a second implantation process is performed upon the PMOS transistor regions 14 using P-type dopants, e.g. boron, to form a source/drain region 40 in each PMOS transistor region 14. As shown in FIG. 5, the masking pattern 38 is removed, and a high-temperature annealing process, such as a rapid thermal process, is performed to drive-in the source/drain regions 30 in the NMOS transistor regions 12 and the source/drain regions 40 in the PMOS transistor regions 14.

Figure 6:
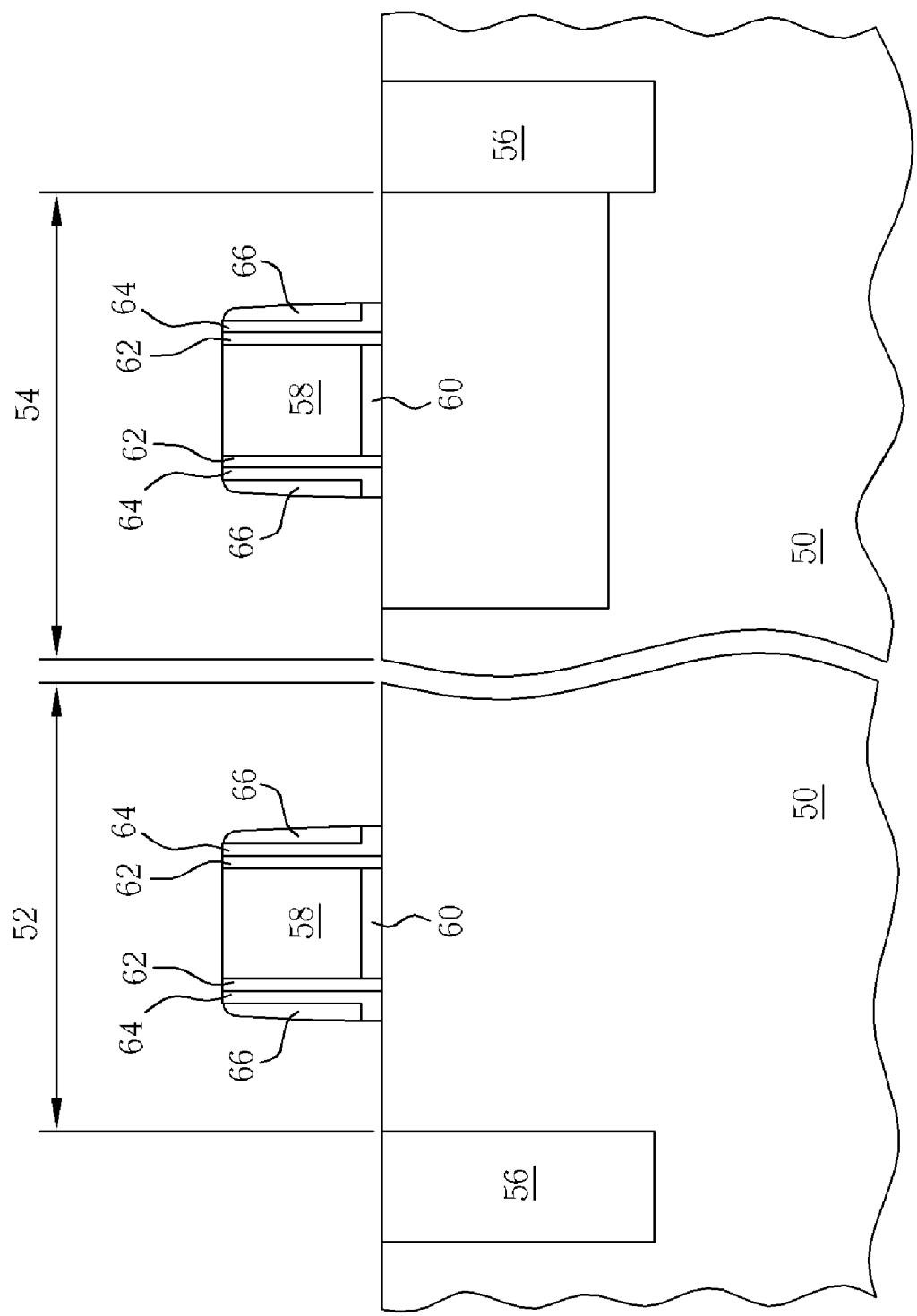
FIG. 6 through FIG. 10 are schematic diagrams illustrating a method of manufacturing MOS transistors according to a second preferred embodiment of the present invention.

Please refer to FIG. 6 through FIG. 10, which are schematic diagrams illustrating a method of manufacturing MOS transistors according to a second preferred embodiment of the present invention. As shown in FIG. 6, a substrate 50, such as a silicon substrate, is provided. The substrate 50 includes a plurality of NMOS transistor regions 52 and a plurality of PMOS transistor regions 54 insulated by a plurality of STIs 56. The substrate 50 further includes a plurality of polysilicon gate structures 58 respectively positioned in each NMOS transistor region 52 and in each PMOS transistor region 54, and a plurality of gate insulating layers 60 positioned between each polysilicon gate structure 58 and the substrate 50. Subsequently, a liner layer 62, a dielectric layer 64, and a spacer 66 are respectively formed alongside each polysilicon gate structure 58 using deposition, lithographic, and etching processes.

Figure 7:
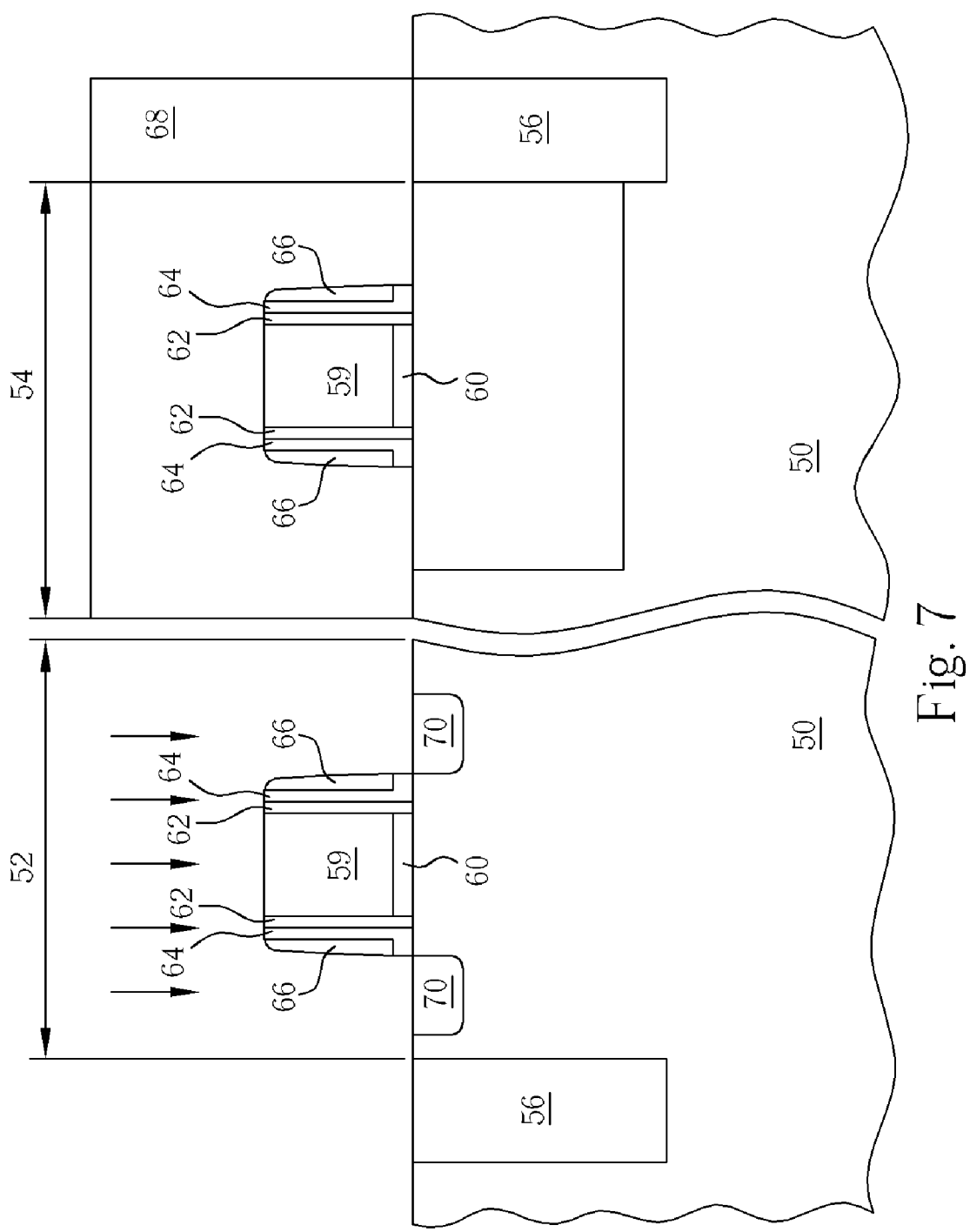
Figure 8:
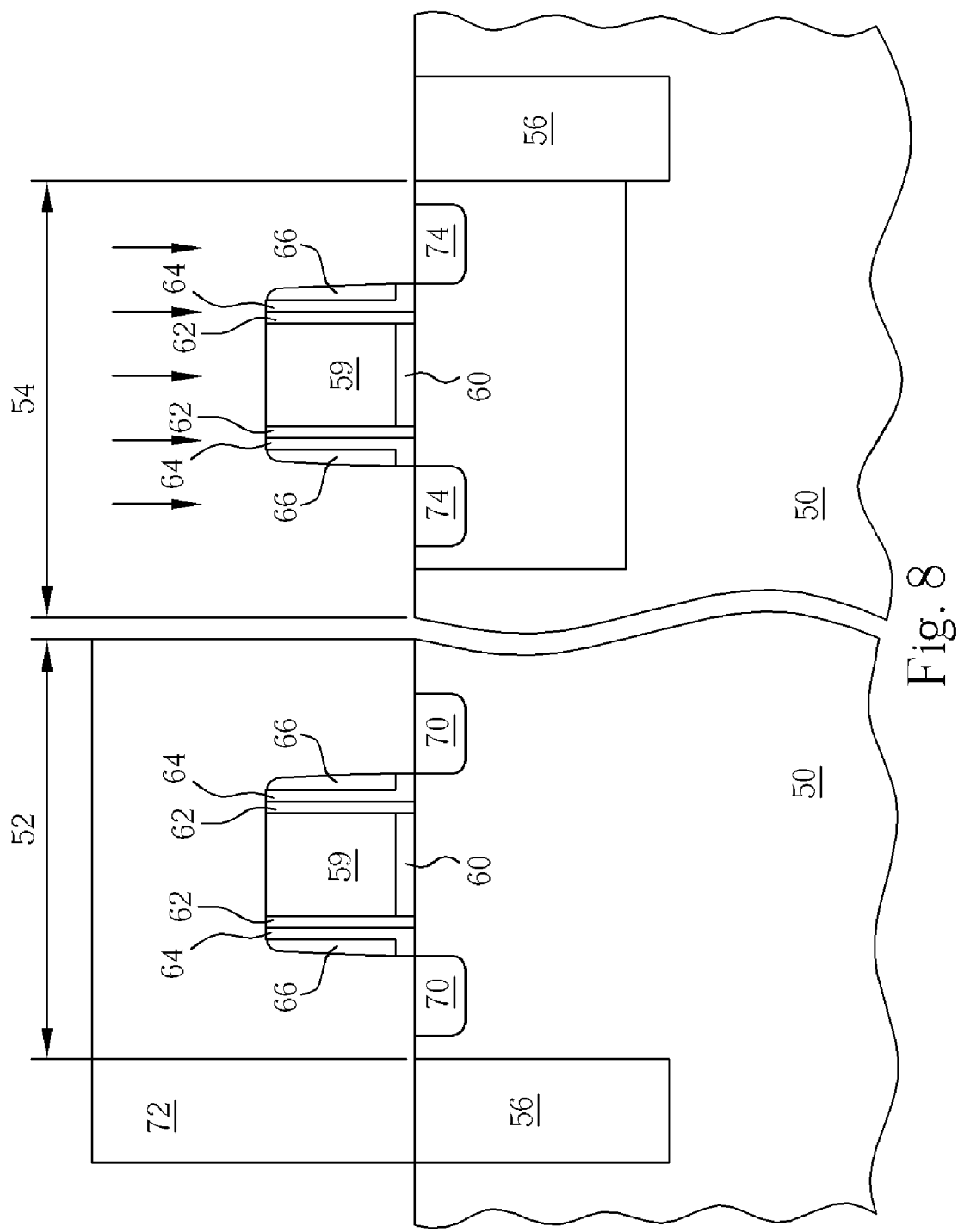

As shown in FIG. 7, a pre-amorphization (PAI) process is carried out to transfer each polysilicon gate structre 58 to an amorphous-silicon gate structure 59. Subsequently, a masking pattern 68, such as a photoresist pattern, is formed over the PMOS transistor regions 54, and a first implantation process is subsequently performed upon the NMOS transistor regions 52 using N-type dopants, e.g. arsenic or phosphorous, to form a source/drain region 70 in each NMOS transistor region 52. As shown in FIG. 8, the masking pattern 68 is removed. Then, another masking pattern 72 is formed over the NMOS transistor regions 52, and a second implantation process is performed upon the PMOS transistor regions 54 using P-type dopants, e.g. boron, to form a source/drain region 74 in each PMOS transistor region 54. The PAI process can also be performed subsequent to the second implantation process where necessary.

Figure 9:
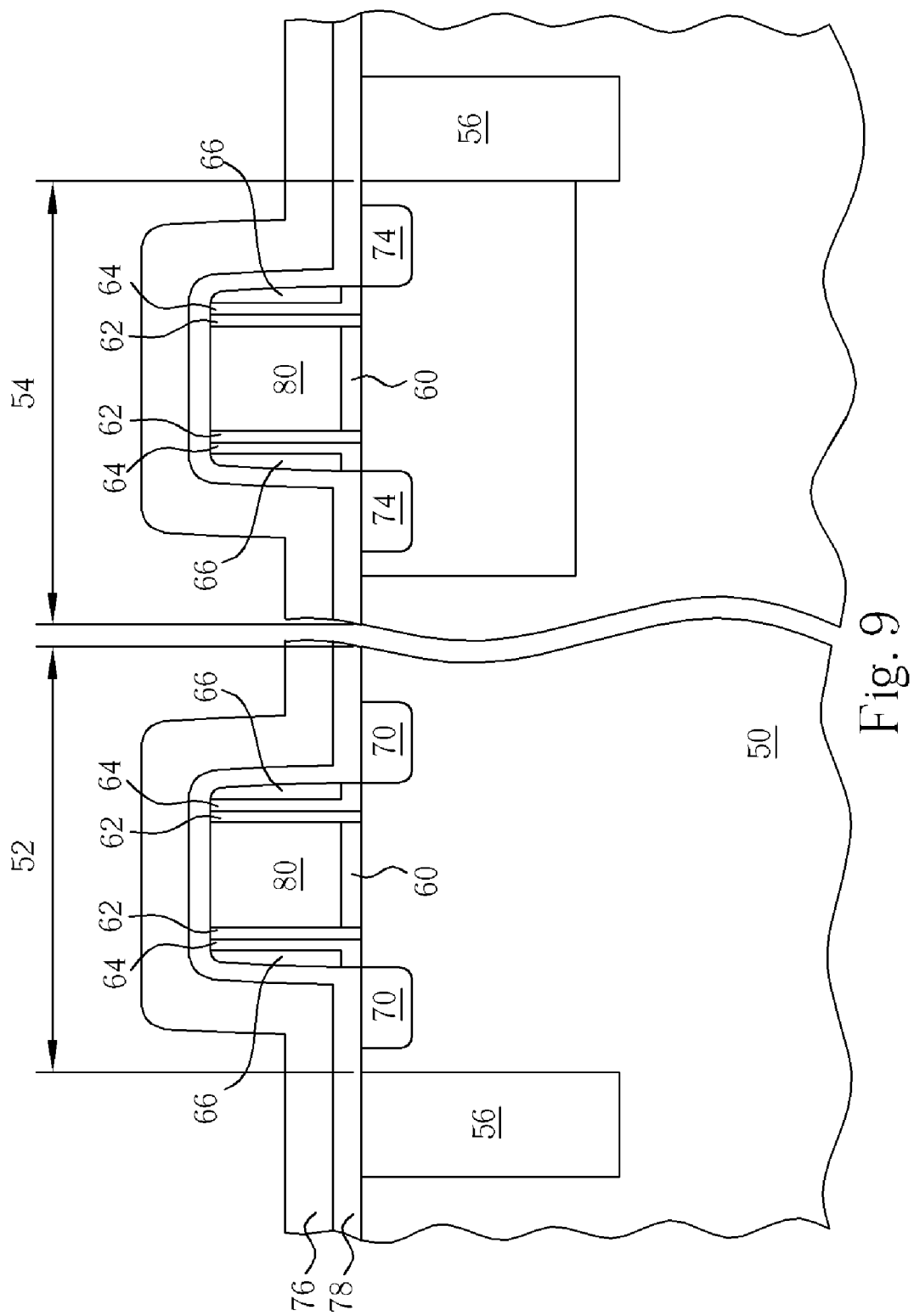
Figure 10:
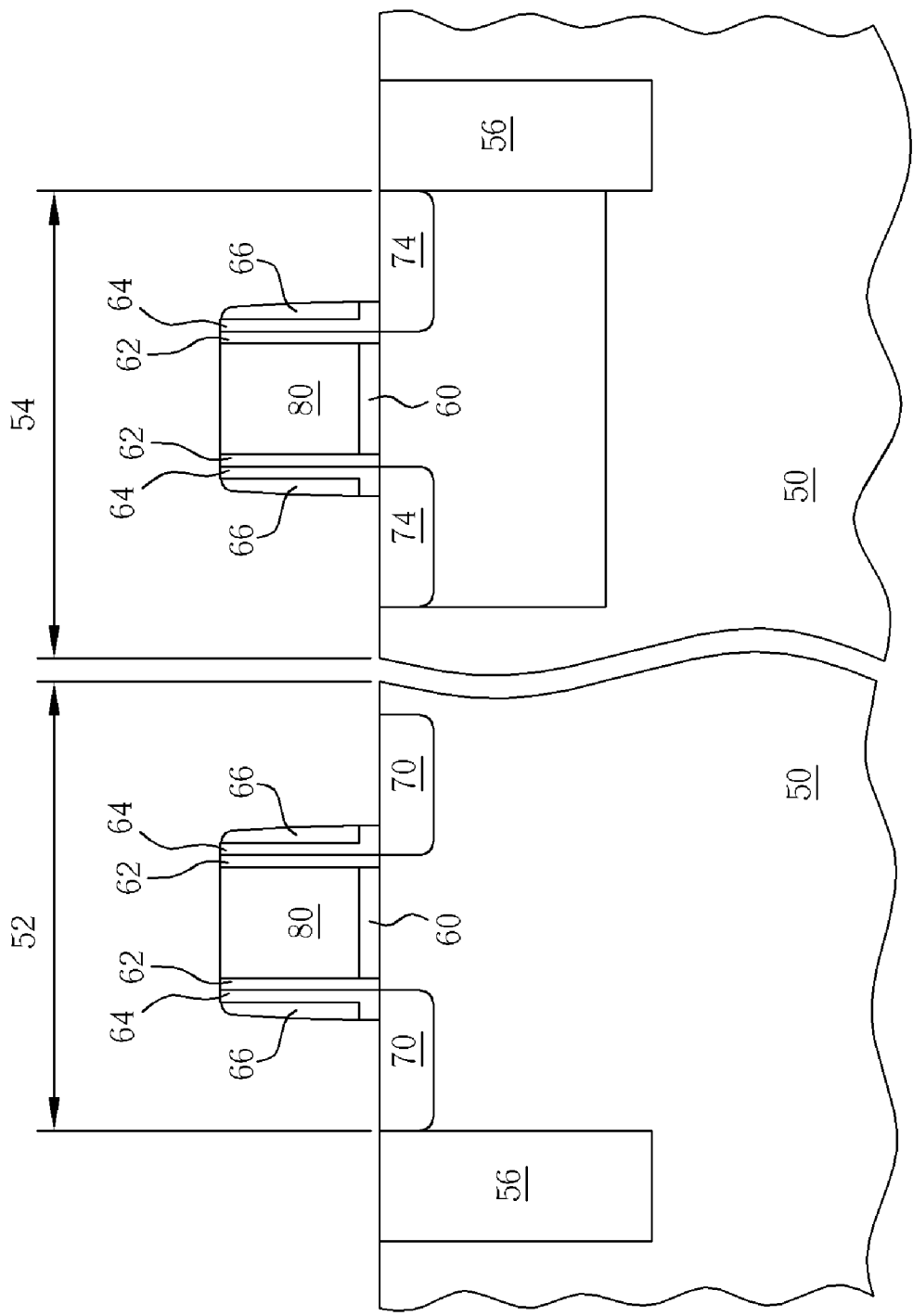

As shown in FIG. 9, the masking pattern 72 is removed. Following that, a high-tensile thin film 76 is deposited across the substrate 50. In this embodiment, the high-tensile thin film 76 is a silicon nitride thin film, and a silicon oxide thin film 78 is formed on the substrate 50 prior to forming the high-tensile thin film 76. Then, a two-stage annealing process is performed. The two-stage annealing includes a low-temperature annealing process for recrystallizing the amorphous-silicon gate structures 59 into polysilicon gate structures 80, and a high-temperature annealing process, such as a rapid thermal process, for driving-in the source/drain regions 70 in the NMOS transistor regions 52 and the source/drain regions 74 in the PMOS transistor regions 54. The polysilicon gate structures 80 are able to enlarge the lattice constant of the substrate 50 thereunder, and thus the carrier mobility is improved. In this embodiment, the low-temperature annealing process is a low-temperature oxygen annealing process or a low-temperature nitrogen annealing process performed at a temperature between 100 C and 1000 C, and is preferably 525 C, and preferably at about 525 C. As shown in FIG. 10, the high-tensile thin film 76 and the silicon oxide thin film 78 are entirely removed.

It is to be appreciated that the present invention is not limited to the aforementioned preferred embodiments. For example, the first implantation process and the second implantation process can be performed subsequent to the low-temperature annealing process. The low-temperature annealing process and the high-temperature annealing process are not limited to be performed in a two-stage way, and can be carried out separately. In addition, since the deposition process for forming the high-tensile thin film (silicon nitride thin film) utilizes silicon hydride (SiH) as a precursor, hydrogen tends to get into the substrate. This results in boron (P-type dopant) penetration, and therefore yields punch-through in the PMOS transistor regions. Concerning this problem, a low-temperature annealing process is performed to inhibit boron penetration. Furthermore, the boron penetration problem would likely never happen in the first preferred embodiment since the second implantation process is performed after the low-temperature annealing process.

The present invention utilizes a high-tensile thin film in combination with an annealing process for recrystallizing the amorphous-silicon gate structures into polysilicon gate structures, thereby altering the band structure of the substrate in the channel region. Consequently, the carrier mobility is improved. In addition, the method of the present invention is not limited to be implemented using a traditional substrate, such as a silicon substrate or an SOI substrate, and can be implemented using a strained silicon substrate for further improving the carrier mobility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing MOS transistors, comprising:
    providing a substrate comprising a plurality of NMOS transistor regions and a plurality of PMOS transistor regions, the substrate further comprising a plurality of gate structures positioned in each NMOS transistor region and in each PMOS transistor region, the gate structures being polysilicon gate structures;
    performing a pre-amorphization (PAI) process to transfer each polysilicon gate structure to an amorphous-silicon gate structure;
    forming a high-tensile thin film on the substrate, the high-tensile thin film covering the gate structures;
    performing an annealing process, wherein the annealing process is a low-temperature annealing process for recrystallizing the amorphous-silicon gate structures into a plurality of polysilicon gate structures; and
    removing the high-tensile thin film.

2. The method of claim 1, further comprising performing a first implantation process and a second implantation process to respectively form a source/drain region in each NMOS transistor region and a source/drain region in each PMOS transistor region prior to forming the high-tensile thin film.

3. The method of claim 2, further comprising performing a high-temperature annealing process for driving-in the source/drain region in each NMOS transistor region and the source/drain region in each PMOS transistor region.

4. The method of claim 1, wherein the annealing process is a low-temperature oxygen annealing process.

5. The method of claim 1, wherein the annealing process is a low-temperature nitrogen annealing process.

6. The method of claim 1, further comprising performing a first implantation process and a second implantation process to respectively form a source/drain region in each NMOS transistor region and a source/drain region in each PMOS transistor region subsequent to removing the high-tensile thin film.

7. The method of claim 6, further comprising performing a high-temperature annealing process for driving-in the source/drain region in each NMOS transistor region and the source/drain region in each PMOS transistor region subsequent to the first implantation process and the second implantation process.

8. The method of claim 1, further comprising performing a first implantation process to form a source/drain region in each NMOS transistor region prior to forming the high-tensile thin film.

9. The method of claim 8, further comprising performing a second implantation process to form a source/drain region in each PMOS transistor region subsequent to removing the high-tensile thin film.

10. The method of claim 9, further comprising performing a high-temperature annealing process for driving-in the source/drain region in each NMOS transistor region and the source/drain region in each PMOS transistor region subsequent to the second implantation process.

11. The method of claim 1, wherein the high-tensile thin film is a silicon nitride thin film.

12. The method of claim 11, further comprising forming a silicon oxide thin film on the substrate prior to forming the silicon nitride thin film.

13. A method of manufacturing MOS transistors, comprising:

providing a substrate comprising a plurality of NMOS transistor regions and a plurality of PMOS transistor regions, the substrate further comprising a plurality of gate structures positioned in each NMOS transistor region and in each PMOS transistor region;

forming a high-tensile thin film on the substrate, the high-tensile thin film covering the gate structures;

performing an annealing process; and entirely removing the high-tensile thin film.

* * * * *